(12) United States Patent
Okuno et al.

(10) Patent No.: US 6,265,262 B1
(45) Date of Patent: Jul. 24, 2001

(54) SEMICONDUCTOR DEVICE AND METHOD OF FABRICATING THE SAME

(75) Inventors: Yasutoshi Okuno, Kyoto; Akihiko Tsuzumitani; Yoshihiro Mori, both of Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/587,363

(22) Filed: Jun. 2, 2000

(30) Foreign Application Priority Data

Jun. 2, 1999 (JP) .................................... 11-155043

(51) Int. Cl.$^7$ .............................................. H01L 21/8242
(52) U.S. Cl. .................. 438/253; 438/239; 438/238; 438/256; 257/306; 257/308; 257/486
(58) Field of Search .................. 438/3, 238, 239, 438/244, 253, 255, 240, 241, 242, 243, 245, 248, 250, 256; 257/306, 308, 310, 311, 486

(56) References Cited

U.S. PATENT DOCUMENTS 6,211,035 * 4/2001 Moise et al. ..................... 438/396

FOREIGN PATENT DOCUMENTS 10-93041    4/1998  (JP) .
10-093041 * 4/1998  (JP) .......................... H01L/21/8242

* cited by examiner

*Primary Examiner*—Tuan H. Nguyen
*Assistant Examiner*—Hsien-Ming Lee
(74) *Attorney, Agent, or Firm*—Eric J. Robinson; Nixon Peabody LLP

(57) ABSTRACT

A silicon film is formed within a contact hole formed in a first insulating film on a semiconductor substrate in a manner that an upper portion of the contact hole remains, and a cobalt film is then deposited on the silicon film. Thereafter, a heat treatment is carried out so as to react the silicon film with the cobalt film, thereby forming a cobalt silicide layer in the surface portion of the silicon film. A barrier layer is formed on the cobalt silicide layer so as to completely fill the contact hole, and thus, a plug including the polysilicon film, the cobalt silicide layer and the barrier layer is formed. After a recess is formed in a second insulating film deposited on the first insulating film so as to expose the top surface of the plug, a capacitor bottom electrode, a capacitor dielectric film and a capacitor top electrode are successively formed in the recess.

10 Claims, 14 Drawing Sheets

SEMICONDUCTOR DEVICE AND METHOD OF FABRICATING THE SAME

BACKGROUND OF THE INVENTION

The present invention relates to a semiconductor device including a capacitor buried in an insulating film formed on a semiconductor substrate and a method of fabricating the semiconductor device.

In accordance with refinement of semiconductor devices such as a dynamic random access memory (DRAM), stored charge per unit area, namely, electrostatic capacity, has been increased by forming a capacitor three-dimensionally against a transistor by employing a stack type or trench type memory cell structure instead of a planar type structure.

Now, a conventional semiconductor device will be described with reference to FIG. 12.

As is shown in FIG. 12, on a semiconductor substrate 50 where a transistor (not shown) constituting a memory cell is formed, a first insulating film 51 is formed, and a plug 52 connected to the semiconductor substrate 50 (specifically, a diffused layer of the transistor) is formed in the first insulating film 51. The plug 52 includes a polysilicon film 52a and a barrier layer 52b successively buried in the first insulating film 51.

Furthermore, a second insulating film 53 is formed on the first insulating film 51, and a capacitor 54 connected to the plug 52 is formed in the second insulating film 53. The capacitor 54 includes a bottom electrode 54a, a capacitor dielectric film 54b and a top electrode 54c successively buried in the second insulating film 53.

In the conventional semiconductor device, since the barrier layer 52b is formed on the polysilicon film 52a in the plug 52, the polysilicon film 52a of the plug 52 and the bottom electrode 54a of the capacitor 54 can be prevented from being in contact with each other. As a result, the electric characteristic of the plug 52 can be prevented from degrading through oxidation of the polysilicon film 52a of the plug 52 during the formation of the capacitor 54.

In the conventional semiconductor device, however, there arises a first problem that the electric resistance of the plug 52 mainly including the polysilicon film 52a is increased as the diameter of the plug is reduced in accordance with refinement.

Moreover, the conventional semiconductor device has a second problem that the reliability of the capacitor 54 cannot be guaranteed because the bottom electrode 54 is contaminated or the first insulating film 51 or the second insulating film 53 is excessively etched during the formation of the capacitor 54.

In order to overcome the first problem, the present inventors have examined silicidation of a polysilicon film included in a plug for the purpose of reducing the resistance of the plug connected to the capacitor. Specifically, the polysilicon film included in the plug is silicided by using titanium.

Now, a method of siliciding a polysilicon film included in a plug by using titanium will be described with reference to FIGS. 13(a) through 13(d) and 14(a) through 14(d).

First, as is shown in FIG. 13(a), a contact hole 62 formed in a first interlayer insulating film 61 formed on a silicon substrate 60 is filled with a polysilicon film 63, and then, an upper portion of the polysilicon film 63 filled in the contact hole 62 is removed, thereby forming a recess 62a on the polysilicon film 63 in the contact hole 62 as is shown in FIG. 13(b).

Next, as is shown in FIG. 13(c), a titanium film 64 is deposited on the silicon substrate 60 so as to cover the top surface of the polysilicon film 63, and then, the titanium film 64 is subjected to a heat treatment for silicidation, thereby forming a titanium silicide layer 65 as is shown in FIG. 13(d).

The aspect ratio of the recess 62a is set to approximately 0.5 through 1.0 (namely, the recess has a depth of approximately 50 through 100 nm and a diameter of approximately 100 through 200 nm), so that a void cannot be formed within a barrier layer 67 subsequently formed on the titanium silicide layer 65 (as shown in FIG. 14(c). At this point, as is shown in FIG. 13(c), the titanium film 64 is continuously formed not only inside but also outside of the recess 62a. Furthermore, as is shown in FIG. 13(d), the titanium silicide layer 65 is formed not only in the surface portion of the polysilicon film 63 but also in the wall and the outside portion of the recess 62a . In other words, the titanium silicide layer 65 is formed also in the vicinity of the opening of the recess 62a, namely, in the vicinity of the opening of the contact hole 62.

Next, as is shown in FIG. 14(a), an unreacted portion of the titanium film 64 is selectively removed by wet etching, and, as is shown in FIG. 14(b), for example, a TiN film 66 is deposited on the titanium silicide layer 65 so as to completely bury the recess 62a.

Then, as is shown in FIG. 14(c), portions of the TiN film 66 and the titanium silicide layer 65 outside of the recess 62a are removed by the CMP, so that the barrier layer 67 can be formed from the TiN film 66 inside of the titanium silicide layer 65 within the recess 62a. In this manner, a plug 68 including the polysilicon film 63, the titanium silicide layer 65 and the barrier layer 67 is formed in the contact hole 62.

Next, as is shown in FIG. 14(d), a second interlayer insulating film 69 is deposited on the first interlayer insulating film 61, a recess 70 is formed in the second interlayer insulating film 69 so as to expose the top surface of the plug 68, and then, a conductive film 71 serving as a capacitor bottom electrode is deposited on the second interlayer insulating film 69 so as to cover the wall and the bottom of the recess 70.

Subsequently, although not shown in the drawings, a portion of the conductive film 71 outside of the recess 70 is removed, so as to form the capacitor bottom electrode from the conductive film 71 on the wall and the bottom of the recess 70, and thereafter, a capacitor dielectric film and a capacitor top electrode are successively formed on the capacitor bottom electrode.

In this fabrication method, however, the titanium silicide layer 65 and the conductive film 71 are directly in contact with each other (as shown in FIG. 14(d)) when the heat treatment is carried out for improving the electric characteristic of the conductive film 71 after the deposition thereof. Therefore, the titanium silicide layer 65 and the conductive film 71 are reacted with each other, resulting in siliciding the conductive film 71, namely, the capacitor bottom electrode. Furthermore, when the capacitor dielectric film including oxygen is formed on the capacitor bottom electrode, the titanium silicide layer 65 of the plug 68 is oxidized, which increases the resistance of the plug 68. As a result, the plug 68 cannot be utilized.

SUMMARY OF THE INVENTION

In consideration of the aforementioned conventional problems, a first object of the invention is reducing the resistance of a plug by forming a silicide layer in the plug and preventing contact between the silicide layer of the plug and a capacitor bottom electrode, and a second object is improving the reliability of a capacitor.

The present inventors have variously studied the cause of the direct contact between the titanium silicide layer 65 and the conductive film 71 in the conventional method shown in FIGS. 13(a) through 13(d) and 14(a) through 14(d), namely, the reason why the titanium silicide layer 65 is formed not only in the surface portion of the polysilicon film 63 but also in the vicinity of the opening of the recess 62a. As a result, it has been found that the titanium silicide layer 65 is formed also in the vicinity of the opening of the recess 62a because when the silicidation is caused between the titanium film 64 and the polysilicon film 63, silicon atoms constituting the polysilicon film 63 are diffused into titanium atoms constituting the titanium film 64 continuously formed not only inside but also outside of the recess 62a.

Furthermore, the present inventors have silicided a polysilicon film included in a plug by using tungsten. Also in this case, silicon atoms constituting the polysilicon film are diffused into tungsten atoms constituting the tungsten film, and hence, the same problem arises.

Accordingly, the present inventors have examined a method of forming a silicide layer through silicidation caused between a metal film and a polysilicon film with suppressing diffusion of silicon atoms constituting the polysilicon film in to metal atoms constituting the metal film. As a result, it has been found that in the case where a polysilicon film is silicided by using cobalt, namely, a cobalt silicide layer is formed, cobalt atoms constituting the cobalt film are diffused into silicon atoms constituting the polysilicon film.

The present invention was devised based on the findings, and specifically, in order to achieve the first object, the semiconductor device of this invention comprises a plug buried in a first insulating film deposited on a semiconductor substrate; and a capacitor connected to the plug and including a bottom electrode, a capacitor dielectric film and a top electrode successively buried in a second insulating film deposited on the first insulating film, wherein the plug includes a cobalt silicide layer and a barrier layer formed on the cobalt silicide layer.

In the semiconductor device of this invention, since the plug includes the cobalt silicide layer, the resistance of the plug can be reduced. Also, since the plug includes the barrier layer formed on the cobalt silicide layer, the cobalt silicide layer and the bottom electrode of the capacitor can be prevented from being in contact with each other. Accordingly, the bottom electrode can be prevented from being silicided in the formation thereof, and the cobalt silicide layer, namely, the plug, can be prevented from being oxidized in forming the capacitor dielectric film on the bottom electrode.

In the semiconductor device of this invention, a protection insulating film of a SiN film or a SiAlN film is preferably formed on the first insulating film.

Thus, the protection insulating film can be used as an etching stopper in forming a recess for burying the capacitor in the second insulating film. Therefore, the first insulating film can be prevented from being damaged.

In the semiconductor device of this invention, a protection insulating film of a SiN film or a SiAlN film is preferably formed on the second insulating film.

Thus, the protection insulating film can be used as an etching stopper in forming the bottom electrode by depositing the bottom electrode conductive film on the second insulating film where the recess for burying the capacitor is formed and then removing a portion of the bottom electrode conductive film outside of the recess. Therefore, the second insulating film can be prevented from being damaged.

In order to achieve the first object, the first method of fabricating a semiconductor device of this invention comprises a first step of depositing a first insulating film on a semiconductor substrate; a second step of forming a contact hole in the first insulating film; a third step of forming a silicon film within the contact hole in a manner that an upper portion of the contact hole remains; a fourth step of forming a cobalt silicide layer in a surface portion of the silicon film by depositing a cobalt film on the silicon film and conducting a heat treatment for causing a reaction between the silicon film and the cobalt film; a fifth step of forming a barrier layer on the cobalt silicide layer so as to completely fill the contact hole, whereby a plug including the silicon film, the cobalt silicide layer and the barrier layer is formed in the contact hole; a sixth step of depositing a second insulating film on the first insulating film; a seventh step of forming a recess in the second insulating film for exposing a top surface of the plug; and an eighth step of successively forming, in the recess, a capacitor bottom electrode, a capacitor dielectric film and a capacitor top electrode.

In the first method of fabricating a semiconductor device, since the cobalt silicide layer is formed in the plug, the resistance of the plug can be reduced. Also, in forming the cobalt silicide layer in the surface portion of the silicon film by conducting the heat treatment after depositing the cobalt film on the silicon film formed in the contact hole with an upper portion thereof remaining, cobalt atoms constituting the cobalt film are diffused into silicon atoms constituting the silicon film. Therefore, the cobalt silicide layer is formed merely in the surface portion of the silicon film. In other words, the cobalt silicide layer is not formed in the vicinity of the opening of the contact hole. Therefore, in forming the barrier layer on the cobalt silicide layer so as to form the plug including the silicon film, the cobalt silicide layer and the barrier layer, the barrier layer can be formed on the entire top surface of the cobalt silicide layer. Accordingly, the cobalt silicide layer of the plug and the capacitor bottom electrode formed on the plug can be prevented from being in contact with each other. As a result, the capacitor bottom electrode can be prevented from being silicided in the formation thereof, and the cobalt silicide layer, namely, the plug, can be prevented from being oxidized in forming the capacitor dielectric film on the capacitor bottom electrode.

The first method of fabricating a semiconductor device, preferably further comprises, between the first step and the second step, a step of forming a protection insulating film from a SiN film or a SiAlN film on the first insulating film.

Thus, the protection insulating film can be used as an etching stopper in forming the recess in the second insulating film, and hence, the first insulating film can be prevented from being damaged.

In order to achieve the second object, the second method of fabricating a semiconductor device of this invention comprises a first step of depositing an insulating film on a semiconductor substrate; a second step of forming a first recess in the insulating film; a third step of depositing a conductive film on the insulating film after forming the first recess in a manner that a second recess is formed inside of the conductive film within the first recess; a fourth step of filling the second recess with a protection film; a fifth step of forming a capacitor bottom electrode from the conductive film on a wall and a bottom of the first recess by removing a portion of the conductive film outside of the first recess;

and a sixth step of exposing the capacitor bottom electrode by removing the protection film and successively forming a capacitor dielectric film and a capacitor top electrode on the capacitor bottom electrode.

In the second method of fabricating a semiconductor device, after the conductive film is deposited on the insulating film in which the first recess has been formed so that the second recess can be formed inside of the conductive film within the first recess, the second recess is filled with the protection film, and thereafter, a portion of the conductive film outside of the first recess is removed, thereby forming the capacitor bottom electrode from the conductive film on the wall and the bottom of the first recess. Therefore, while the portion of the conductive film inside of the first recess, namely, the portion of the conductive film to be formed into the capacitor bottom electrode is being covered with the protection film, the portion of the conductive film outside of the first recess, namely, the portion of the conductive film not formed into the capacitor bottom electrode is removed. Accordingly, the capacitor bottom electrode can be prevented from being contaminated with etching residue, slurry for chemical mechanical polishing (CMP) or the like, resulting in improving the reliability of the capacitor. Also, in the case where a conductive film that is oxidized when exposed to oxygen plasma, such as aruthenium film, is used as the capacitor bottom electrode, the capacitor bottom electrode can be prevented from deforming through oxidation.

The second method of fabricating a semiconductor device preferably further comprises, between the first step and the second step, a step of forming a protection insulating film from a SiN film or a SiAlN film on the insulating film.

Thus, the protection insulating film can be used as an etching stopper in removing the portion of the conductive film outside of the first recess, and hence, the insulating film can be prevented from being damaged. Also, the protection insulating film can be used as a mask in removing the protection film, and hence, the insulating film can be prevented from being damaged.

In the second method of fabricating a semiconductor device, the conductive film is preferably formed from a platinum film, and the third step preferably includes a step of conducting a heat treatment on the conductive film at approximately 400 through 750° C. after depositing the conductive film.

Thus, the step coverage of the conductive film can be improved through grain growth, and hence, the conductive film, namely, the capacitor bottom electrode, can be prevented from having a small thickness at its bent portions. Accordingly, the capacitor dielectric film deposited on the capacitor bottom electrode can be prevented from having a small thickness at its bent portions due to the step coverage of the capacitor dielectric film. As a result, a leakage current caused between the capacitor bottom electrode and the capacitor top electrode can be suppressed from increasing.

In the second method of fabricating a semiconductor device, in the fifth step, the portion of the conductive film outside of the first recess is preferably removed by conducting material etching process on the conductive film with the protection film used as a mask.

Thus, higher etch selectivity against the conductive film can be attained as compared with a conventional etch back method using aresist, and hence, the portion of the conductive film outside of the first recess can be accurately and easily removed.

In the second method of fabricating a semiconductor device, wherein the protection film preferably has an insulating property, and in the sixth step, the protection film is preferably removed with a part of the protection film allowed to remain on a bent portion of the capacitor bottom electrode.

Thus, even when the capacitor bottom electrode has a small thickness at a bent portion thereof, the portion with the small thickness can be covered with the remaining protection film. Therefore, the capacitor dielectric film deposited on the capacitor bottom electrode can be prevented from having a small thickness at a bent portion thereof due to the step coverage of the capacitor dielectric film. As a result, a leakage current caused between the capacitor bottom electrode and the capacitor top electrode can be suppressed from increasing. Also, even when the capacitor dielectric film has a small thickness at a bent portion thereof, short-circuit between the capacitor bottom electrode and the capacitor top electrode can be avoided owing to the protection film remaining below the portion with the small thickness.

DETAILED DESCRIPTION OF THE INVENTION

Prior to description of preferred embodiments of the invention, the principle of the invention for achieving the first object, namely, the object to reduce the resistance of a plug by forming a silicide layer In the plug and to prevent contact between the silicide layer of the plug and a capacitor bottom electrode, will be described with reference to the accompanying drawings.

FIGS. 1(a) through 1(d) and 2(a) through 2(d) are sectional views for showing procedures in a method of siliciding a polysilicon film included in a plug by using cobalt.

Figure 1A:
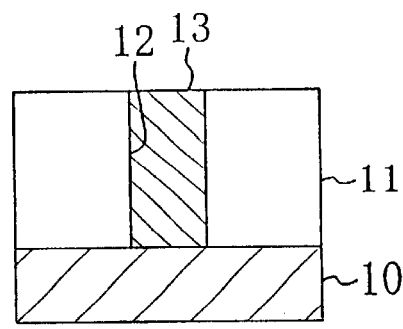
FIGS. 1(a) through 1(d) are sectional views for showing procedures in a method of siliciding a polysilicon film included in a plug by using cobalt.
Figure 1B:
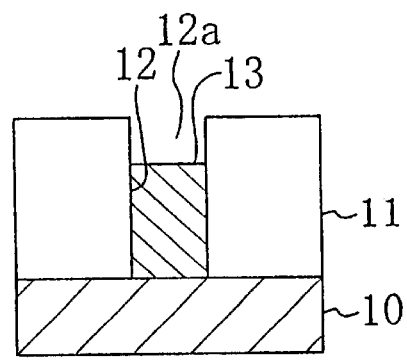

First, as is shown in FIG. 1(a), a contact hole 12 formed in a first interlayer insulating film 11 on a silicon substrate 10 is filled with a polysilicon film 13, and then, an upper portion of the polysilicon film 13 filled in the contact hole 12 is removed, thereby forming a recess 12a on the polysilicon film 13 in the contact hole 12 as is shown in FIG. 1(b).

Figure 1C:
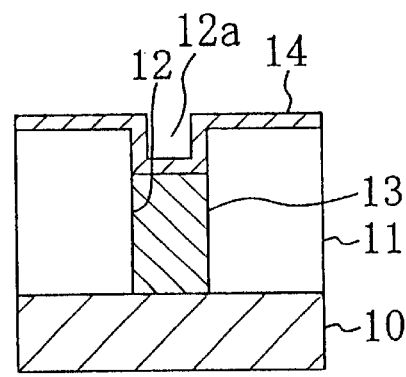
Figure 1D:
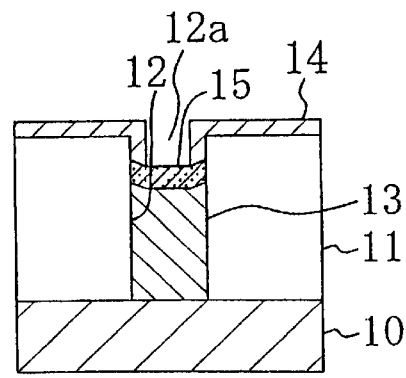

Next, as is shown in FIG. 1(c), acobalt film 14 is deposited on the silicon substrate 10 so as to cover the top surface of the polysilicon film 13, and then, the cobalt film 14 is subjected to a heat treatment for silicidation, thereby forming a cobalt silicide layer 15 as is shown in FIG. 1(d).

At this point, since cobalt atoms constituting the cobalt film 14 are diffused into silicon atoms constituting the polysilicon film 13, the cobalt silicide layer 15 is formed merely in the surface portion of the polysilicon film 13. In other words, the cobalt silicide layer 15 is formed neither outside of the recess 12a, namely, outside of the contact hole 12, nor in the vicinity of the opening of the contact hole 12.

Figure 2A:
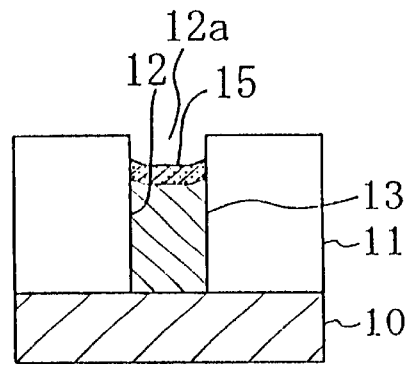
FIGS. 2(a) through 2(d) are sectional views for showing other procedures in the method of siliciding the polysilicon film included in the plug by using cobalt.
Figure 2B:
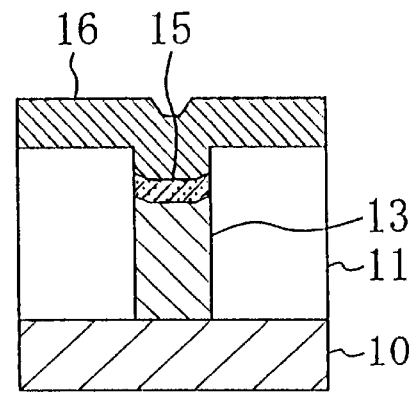

Next, as is shown in FIG. 2(a), an unreacted portion of the cobalt film 14 is selectively removed by, for example, wet etching, and then, as is shown in FIG. 2(b), for example, a TiN film 16 is deposited on the cobalt silicide layer 15 so as to completely bury the recess 12a.

Figure 2C:
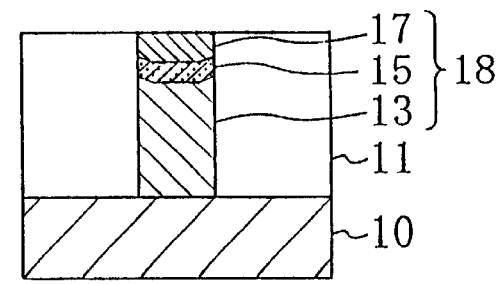

Then, as is shown in FIG. 2(c), a portion of the TiN film 16 outside of the recess 12a is removed by, for example, the CMP, thereby forming a barrier layer 17 from the TiN film 16 on the cobalt silicide layer 15 within the recess 12a. In this manner, a plug 18 including the polysilicon film 13, the cobalt silicide layer 15 and the barrier layer 17 is formed in the contact hole 12.

At this point, since the cobalt silicide layer 15 is formed merely in the surface portion of the polysilicon film 13 in the procedure shown in FIG. 1(d), the barrier layer 17 is formed on the entire top surface of the cobalt silicide layer 15 in the plug 18.

Figure 2D:
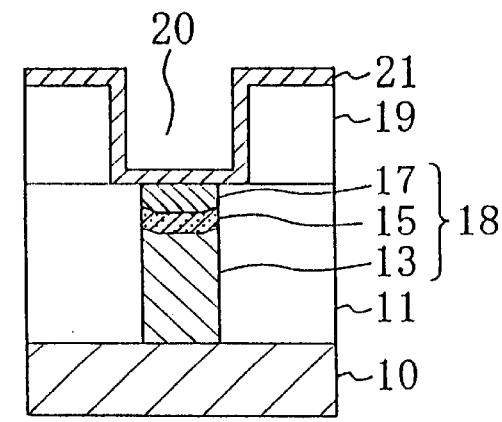

Next, as is shown in FIG. 2(d), a second interlayer insulating film 19 is deposited on the first interlayer insulating film 11, and then, a recess 20 is formed in the second interlayer insulating film 19 so as to expose the top surface of the plug 18. Thereafter, a conductive film 21 to be formed into a capacitor bottom electrode is deposited on the second interlayer insulating film 19 so as to cover the wall and the bottom of the recess 20.

At this point, since the barrier layer 17 is formed on the entire top surface of the cobalt silicide layer 15 in the procedure shown in FIG. 2(c), the cobalt silicide layer 15 can be prevented from being in contact with the conductive film 21, namely, the capacitor bottom electrode.

Subsequently, although not shown in the drawings, a portion of the conductive film 21 outside of the recess 20 is removed, so as to form the capacitor bottom electrode from the conductive film 21 on the wall and the bottom of the recess 20, and thereafter, a capacitor dielectric film and a capacitor top electrode are successively formed on the capacitor bottom electrode.

EMBODIMENT 1

A semiconductor device according to Embodiment 1 of the invention, specifically, a semiconductor device fabricated by the method shown in FIGS. 1(a) through 1(d) and 2(a) through 2(d), will now be described with reference to the drawings. The semiconductor device of Embodiment 1 is applied to a DRAM including one-transistor and one-capacitor type memory cells arranged in a matrix, which does not limit the invention, and the invention is applicable to other semiconductor memory devices or semiconductor devices including both a memory and a logic circuit.

Figure 3:
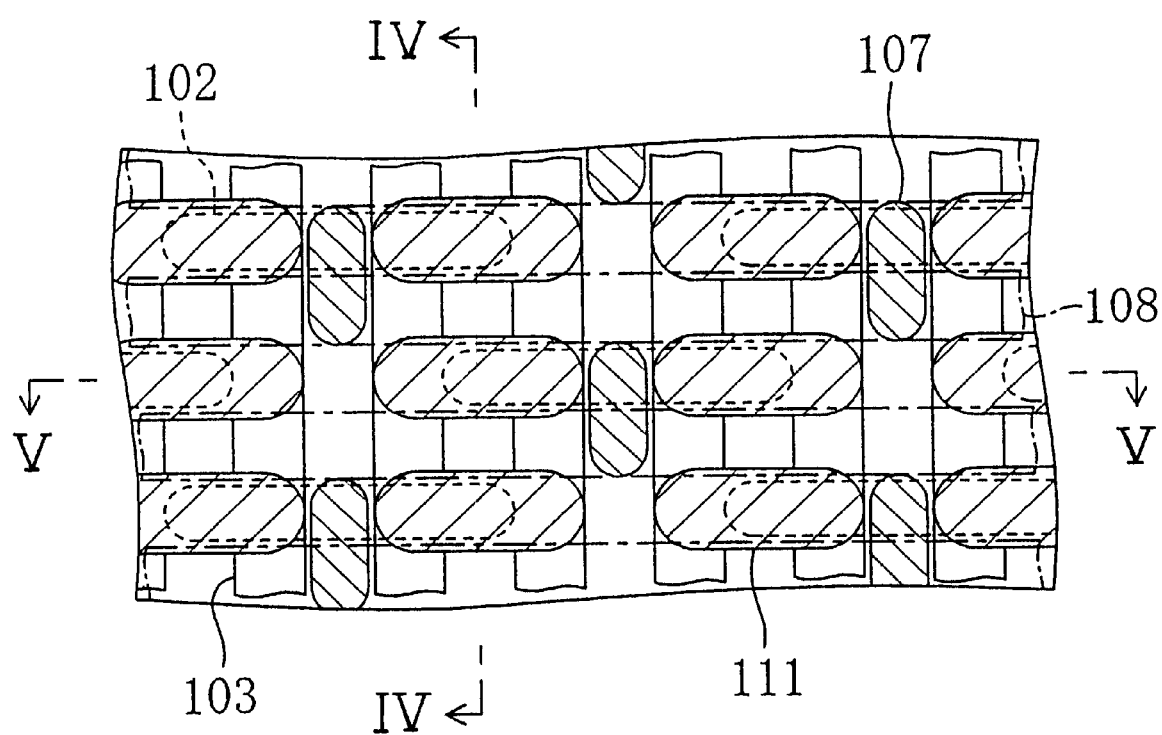
FIG. 3 is a plan view of a semiconductor device of Embodiment 1.
Figure 4:
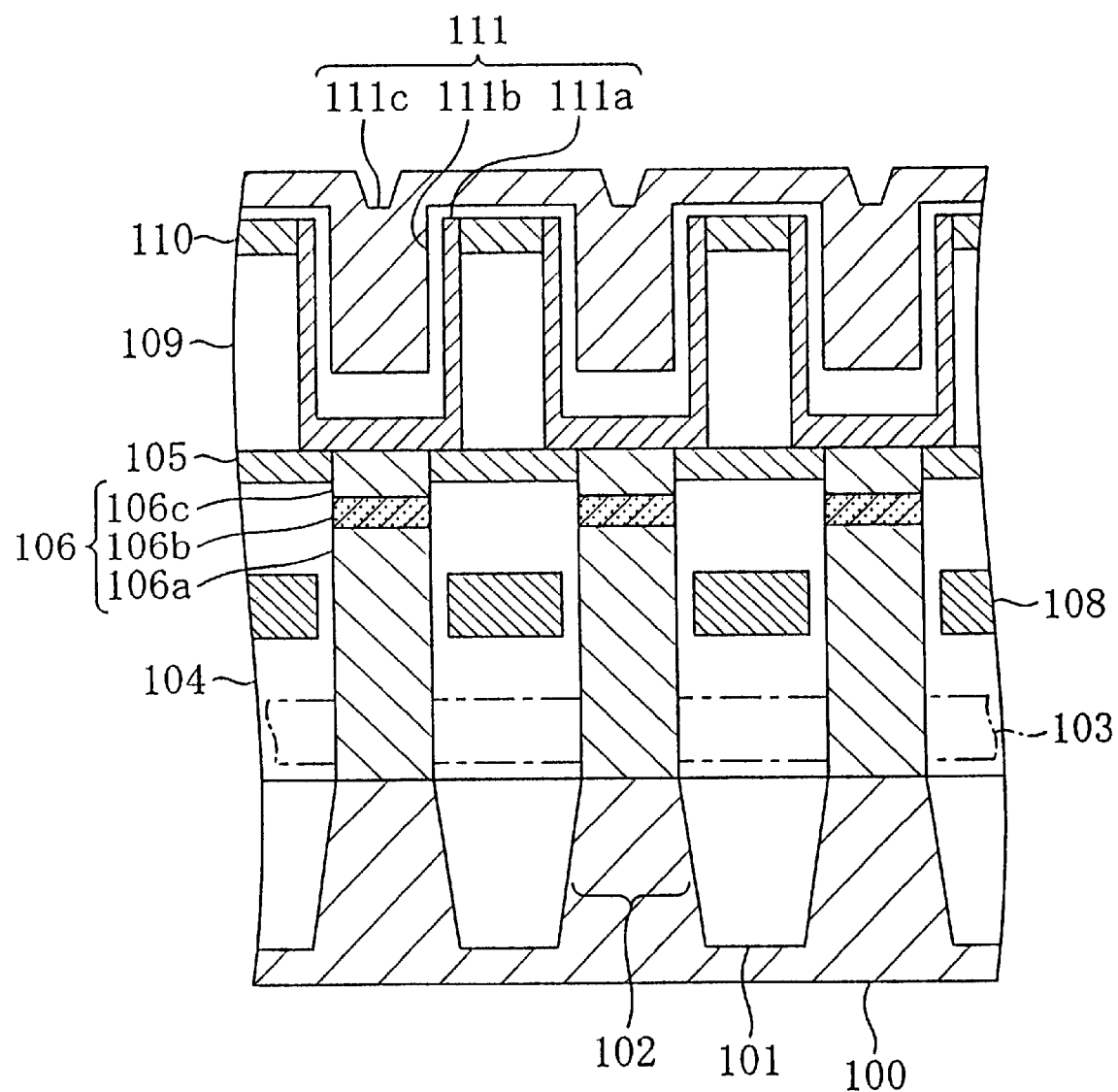
FIG. 4 is a sectional view taken on line I—I of FIG. 3.
Figure 5:
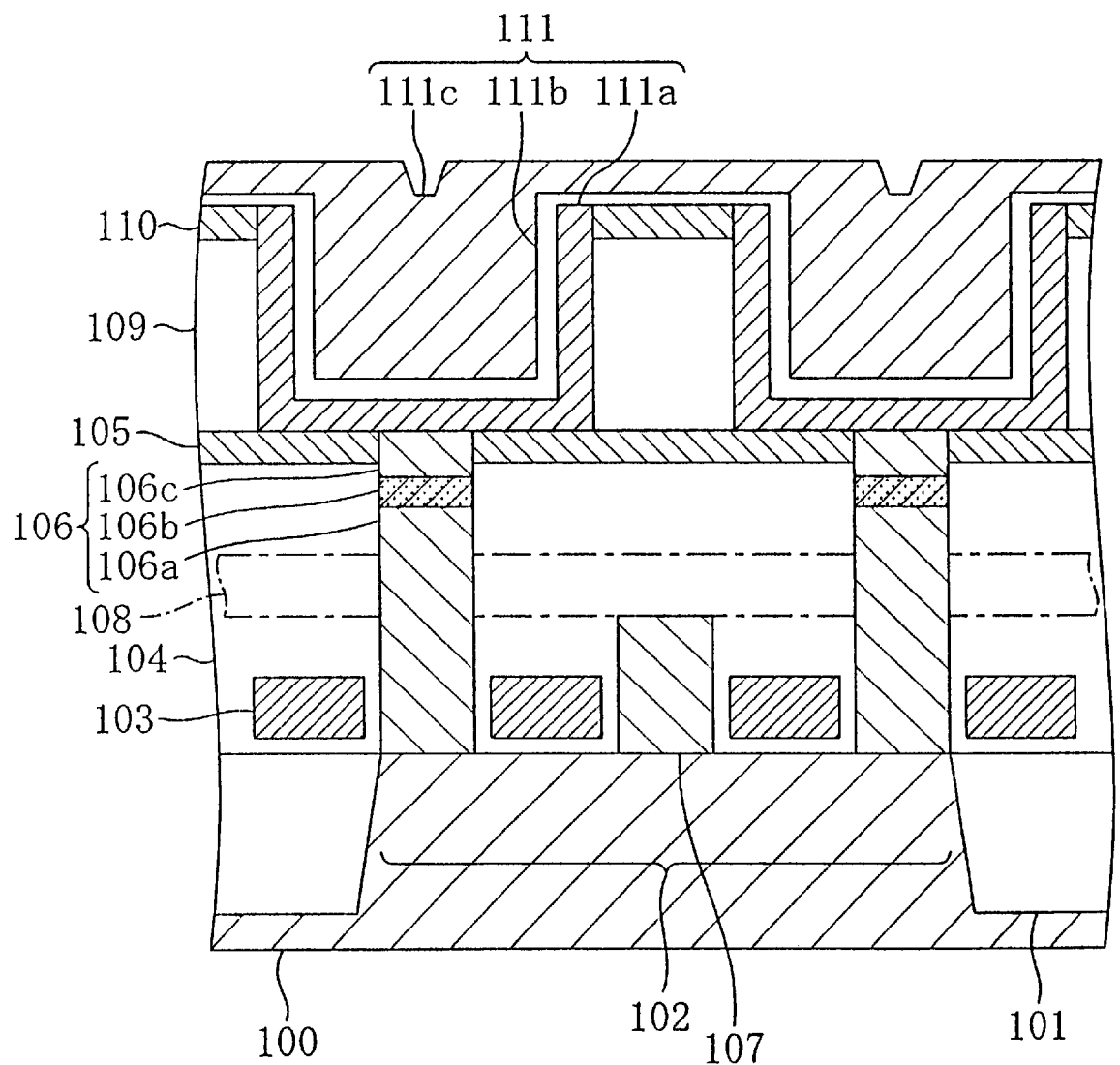
FIG. 5 is a sectional view taken on line II—II of FIG. 3.
Figure 6A:
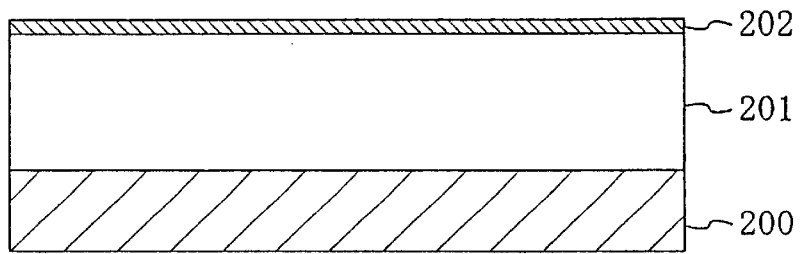
FIGS. 6(a) through 6(d) are sectional views for showing procedures in a method of fabricating a semiconductor device of Embodiment 2.
Figure 6B:
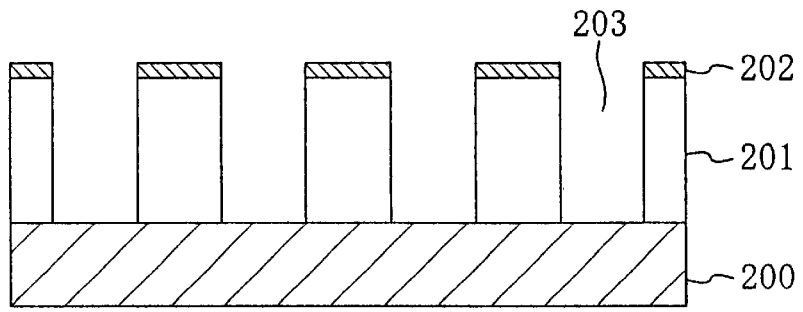
Figure 6C:
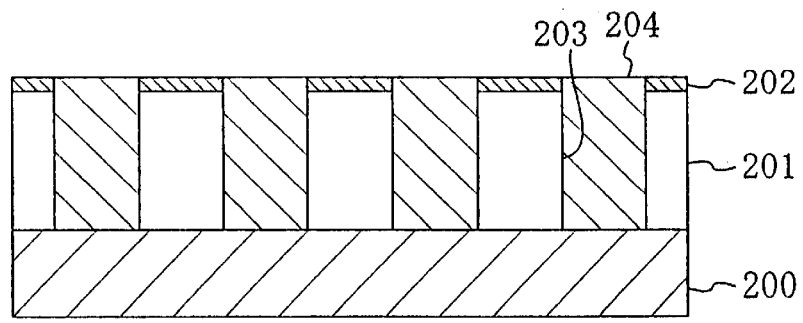
Figure 6D:
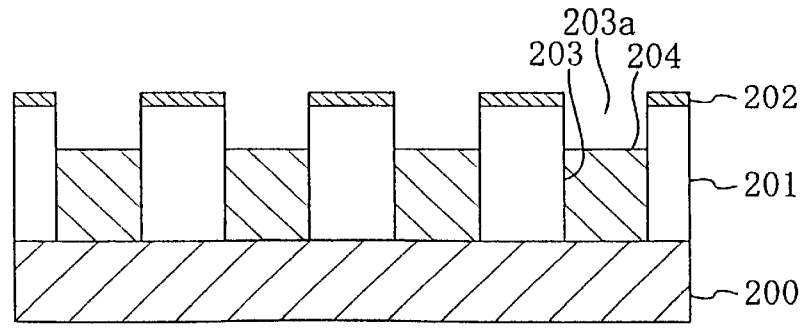
Figure 7A:
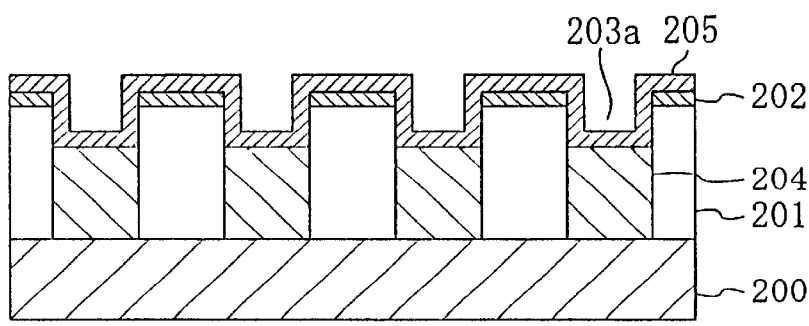
FIGS. 7(a) through 7(d) are sectional views for showing other procedures in the method of fabricating a semiconductor device of Embodiment 2.
Figure 7B:
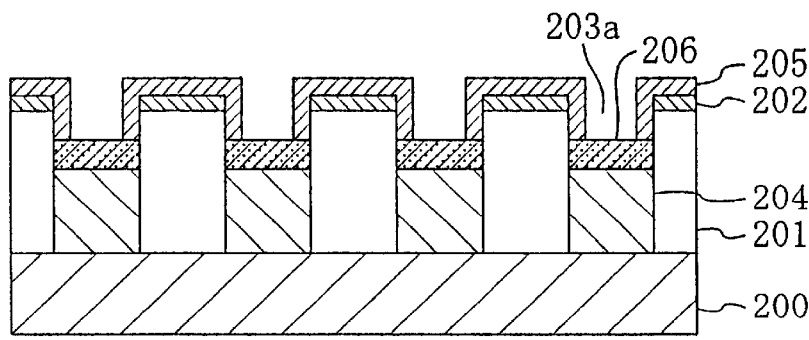
Figure 7C:
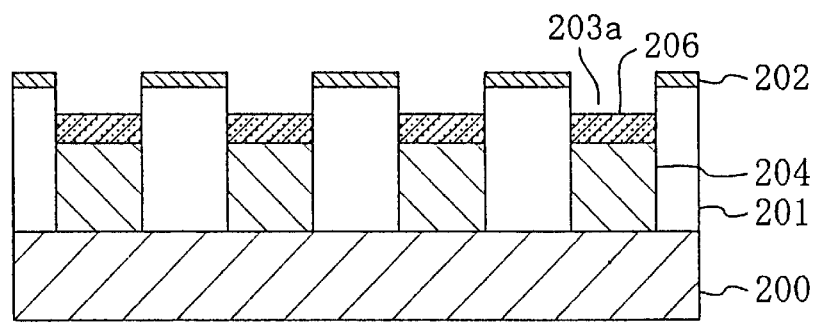
Figure 7D:
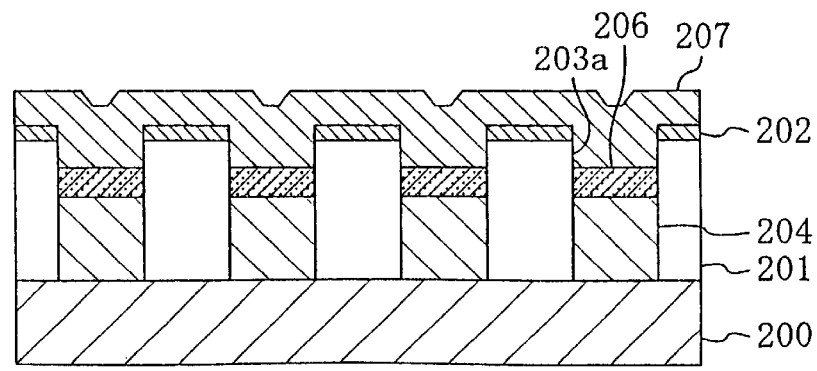

FIG. 3 is a plan view of the semiconductor device of Embodiment 1, FIG. 4 is a sectional view taken on line I—I of FIG. 3 and FIG. 5 is a sectional view taken on line II—II of FIG. 3.

As shown in FIGS. 3 through 5, an active region 102 surrounded with an STI (shallow trench isolation) 101 is formed in a silicon substrate 100, and a word line 103 serving as a gate electrode is formed on a channel region of the active region 102. Also, a first interlayer insulating film 104 of, for example, a $SiO_2$ film and a first protection insulating film 105 of, for example, SiN film are successively deposited on the silicon substrate 100, and a plug (storage node contact) 106 electrically connected to a source region of the active region 102 is formed in the first interlayer insulating film 104 and the first protection insulating film 105. The plug 106 includes a polysilicon film 106a, a cobalt silicide layer 106b and a barrier layer 106c successively buried in the first interlayer insulating film 104 and the first protection insulating film 105. The barrier layer 106c is formed from, for example, a TiN film or a TiAlN film.

The semiconductor device of this embodiment is fabricated by the method shown in FIGS. 1(a) through 1(d) and 2(a) through 2(d), and therefore, the barrier layer 106c is formed on the entire top surface of the cobalt silicide layer 106b in the plug 106.

Furthermore, a bit line contact 107 electrically connected to a drain region of the active region 102 is formed at a lower portion of the first interlayer insulating film 104, and a bit line 108 electrically connected to the bit line contact 107 is formed in the first interlayer insulating film 104 above the bit line contact 107.

Moreover, a second interlayer insulating film 109 of, for example, a $SiO_2$ film and a second protection insulating film 110 of, for example, a SiN film are successively deposited on the first protection insulating film 105, and a capacitor 111 electrically connected to the plug 106 is formed in the second interlayer insulating film 109 and the second protection insulating film 110. The capacitor 111 includes a bottom electrode 111a, a capacitor dielectric film 111b and a top electrode 111c successively buried in the second interlayer insulating film 109 and the second protection insulating film 110. The bottom electrode 111a or the top electrode 111c is formed from, for example, a platinum film. The capacitor dielectric film 111b is formed from, for example, a BST (barium strontium oxide) film.

According to Embodiment 1, since the plug 106 includes the cobalt silicide layer 106b, the resistance of the plug 106 can be reduced. Furthermore, since the plug 106 includes the barrier layer 106c formed on the entire top surface of the cobalt silicide layer 106b, the cobalt silicide layer 106b can be prevented from being in contact with the bottom electrode 111a of the capacitor 111. Accordingly, in the formation of the bottom electrode 111a, the bottom electrode 111a can be prevented from being silicided, and in addition, in the formation of the capacitor dielectric film 111b on the bottom electrode 111a, the cobalt silicide layer 106b, namely, the plug 106, can be prevented from being oxidized.

Moreover, in Embodiment 1, since the first protection insulating film 105 of the SiN film is formed on the first interlayer insulating film 104, the first protection insulating film 105 can be used as an etching stopper in forming the recess for burying the capacitor 111 in the second interlayer insulating film 109. Accordingly, the first interlayer insulating film 104 can be prevented from being damaged.

Also in Embodiment 1, since the second protection insulating film 110 of the SiN film is formed on the second interlayer insulating film 109, the second protection insulating film 110 can be used as an etching stopper in the formation of the bottom electrode 111*a*, specifically, in depositing the conductive film for the bottom electrode on the second interlayer insulating film 109 where the recess for burying the capacitor 111 has been formed and removing a portion of the conductive film for the bottom electrode outside of the recess so as to form the bottom electrode 111*a* in the recess. Accordingly, the second interlayer insulating film 109 can be prevented from being damaged.

Although the polysilicon film 106*a* is used for forming the plug 106 in Embodiment 1, the polysilicon film can be replaced with an amorphous silicon film or the like.

Also, although the SiN film is used for forming the first protection insulating film 105 or the second protection insulating film 110 in Embodiment 1, the SiN film can be replaced with a SiAlN film.

Furthermore, although the platinum film is used for forming the bottom electrode 111*a* or the top electrode 111*c* in Embodiment 1, the platinum film can be replaced with a ruthenium (Ru) film, an iridium (Ir) film, a palladium (Pd) film, or an alloy film including at least two metals selected from the group consisting of platinum, ruthenium, iridium and palladium.

Although the BST film is used for forming the capacitor dielectric film 111*b* in Embodiment 1, the BST film can be replaced with a tantalum pentaoxide ($Ta_2O_5$) film or the like.

In addition, although the bit line 108 is formed below the capacitor 111 in Embodiment 1, the bit line 108 can be formed above the capacitor 111.

EMBODIMENT 2

A method of fabricating a semiconductor device according to Embodiment 2 of the invention will now be described with reference to the accompanying drawings.

The method of fabricating a semiconductor device of Embodiment 2 is applied to fabrication of a DRAM including one-transistor and one-capacitor type memory cells arranged in a matrix, which does not limit the invention, and the invention is applicable to fabrication of other semiconductor memory devices and semiconductor devices including both a memory and a logic circuit.

FIGS. 6(*a*) through 6(*d*), 7(*a*) through 7(*d*), 8(*a*) through 8(*c*), 9(*a*) through 9(*c*) and 10(*a*) through 10(*c*) are sectional views for showing procedures in the method of fabricating a semiconductor device of this embodiment.

First, as is shown in FIG. 6(*a*), on a silicon substrate 200 where a transistor (not shown) constituting a memory cell is formed, a first interlayer insulating film 201 of, for example, a $SiO_2$ film is deposited by, for example, the CVD, the first interlayer insulating film 201 is flattened by, for example, the CMP, and then a first protection insulating film 202 of, for example, a SiN film is deposited on the flattened first interlayer insulating film 201.

Next, the first protection insulating film 202 and the first interlayer insulating film 201 are successively subjected to dry etching by using a resist pattern (not shown) formed on the first protection insulating film 202 as a mask, thereby forming a contact hole 203 in the first interlayer insulating film 201 and the first protection insulating film 202 as is shown in FIG. 6(*b*).

Then, as is shown in FIG. 6(*c*), a polysilicon film 204 is filled in the contact hole 203. Specifically, the polysilicon film 204 is deposited on the entire surface of the silicon substrate 200 by, for example, the chemical vapor deposition (CVD) so as to completely bury the contact hole 203, and a portion of the polysilicon film 204 outside of the contact hole 203 is removed by, for example, the CMP or dry etching.

Next, as is shown in FIG. 6(*d*), an upper portion of the polysilicon film 204 filled in the contact hole 203 is removed by, for example, dry etching, thereby forming a recess 203*a* on the polysilicon film 204 within the contact hole 203.

Then, as is shown in FIG. 7(*a*), a cobalt film 205 is deposited on the silicon substrate 200 so as to cover the top surface of the polysilicon film 204, and the cobalt film 205 is then subjected to a heat treatment for silicidation, thereby forming a cobalt silicide layer 206 as is shown in FIG. 7(*b*).

At this point, cobalt atoms constituting the cobalt film 205 are diffused into silicon atoms constituting the polysilicon film 204, and hence, the cobalt silicide layer 206 is formed merely in the surface portion of the polysilicon film 204. In other words, the cobalt silicide layer 206 is formed neither outside of the recess 203*a*, namely, outside of the contact hole 203, nor in the vicinity of the opening of the contact hole 203.

Next, as is shown in FIG. 7(*c*), an unreacted portion of the cobalt film 205 is selectively removed by wet etching, and then, for example, a TiN film 207 is deposited on the cobalt silicide layer 206 so as to completely bury the recess 203*a* as is shown in FIG. 7(*d*).

Figure 8A:
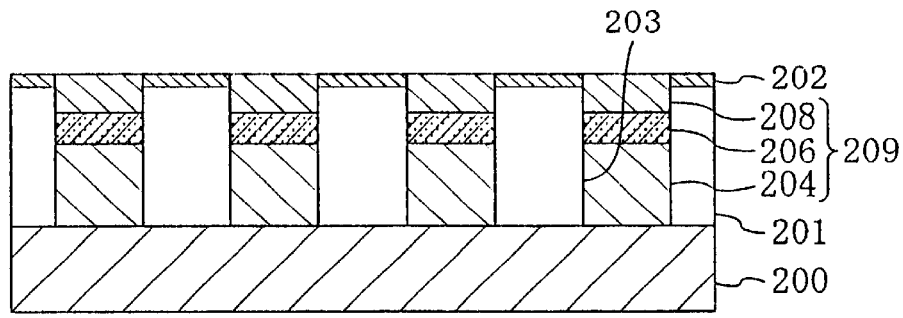
FIGS. 8(a) through 8(c) are sectional views for showing other procedures in the method of fabricating a semiconductor device of Embodiment 2.
Figure 8B:
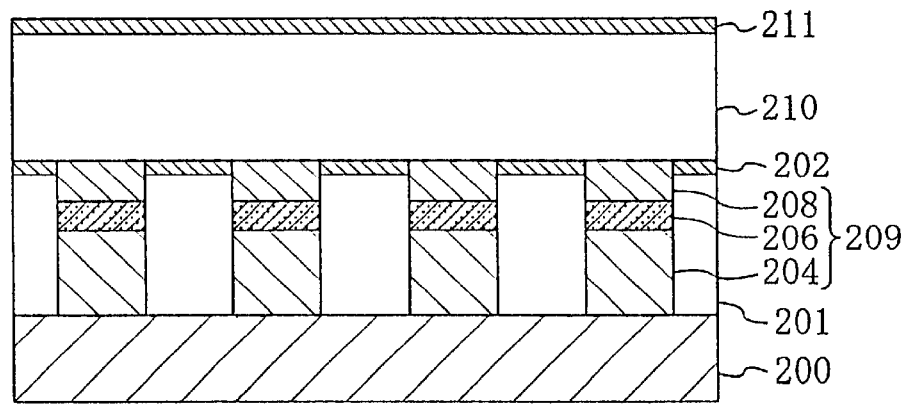
Figure 8C:
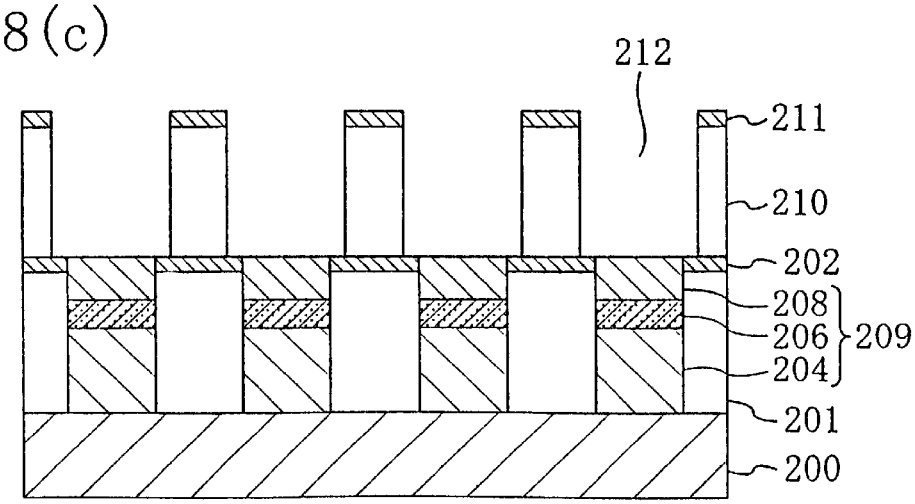

Then, as is shown in FIG. 8(*a*), a portion of the TiN film 207 outside of the contact hole 203 is removed by, for example, the CMP or dry etching, thereby forming a barrier layer 208 from the TiN film 207 on the cobalt silicide layer 206 within the contact hole 203. In this manner, a plug 209 including the polysilicon film 204, the cobalt silicide layer 206 and the barrier layer 208 and electrically connected to the silicon substrate 200 is formed in the contact hole 203.

At this point, since the cobalt silicide layer 206 is formed merely in the surface portion of the polysilicon film 204 in the procedure shown in FIG. 7(*b*), the barrier layer 208 can be formed on the entire top surface of the cobalt silicide layer 206 in the plug 209.

Next, as is shown in FIG. 8(*b*), a second interlayer insulating film 210 of, for example, a $SiO_2$ film and a second protection insulating film 211 of, for example, a SiN film are successively deposited on the entire surface of the silicon substrate 200.

Then, the second protection insulating film 211 and the second interlayer insulating film 210 are successively subjected to dry etching by using a resist pattern (not shown) formed on the second protection insulating film 211 as a mask. Thus, a first recess 212 is formed in the second interlayer insulating film 210 and the second protection insulating film 211 so as to expose the top surface of the plug 209 and a top surface portion of the first protection insulating film 202 in the vicinity of the plug 209.

At this point, since the first protection insulating film 202 (SiN film) has etch selectivity against the second interlayer insulating film 210 ($SiO_2$ film), the first protection insulating film 202 serves as an etching stopper for preventing the first interlayer insulating film 201 from being removed in forming the first recess 212 in the second interlayer insulating film 210.

Figure 9A:
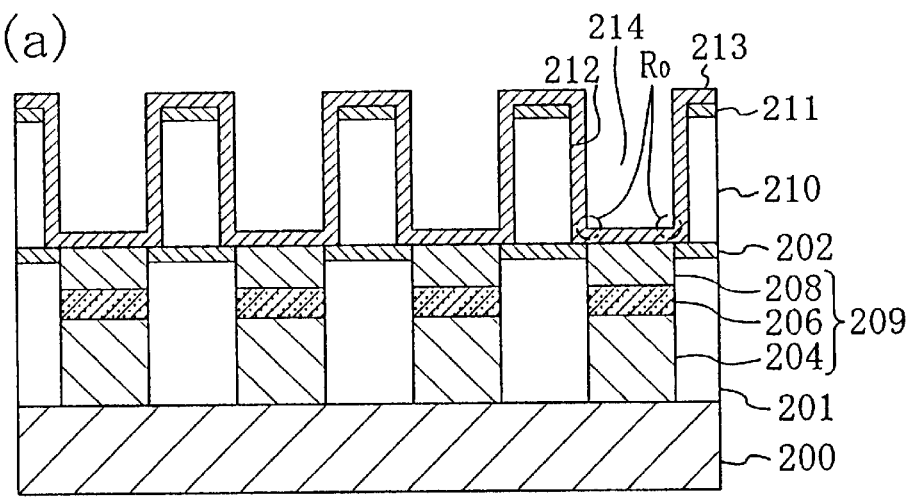
FIGS. 9(a) through 9(c) are sectional views for showing other procedures in the method of fabricating a semiconductor device of Embodiment 2.

Then, as is shown in FIG. 9(a), a first conductive film 213 of, for example, a platinum film is deposited on the entire surface of the silicon substrate 200 so as to cover the wall and the bottom of the first recess 212, namely, so that a second recess 214 can be formed inside of the first conductive film 213 within the first recess 212.

When a platinum film is used for forming the first conductive film 213, the first conductive film 213 is subjected to a heat treatment at approximately 400 through 750° C. after the deposition. Thus, the step coverage of the first conductive film 213 can be improved due to grain growth, so that the first conductive film 213 can be prevented from having a small thickness at its bent portions (shown as $R_o$ in FIG. 9(a)).

Figure 9B:
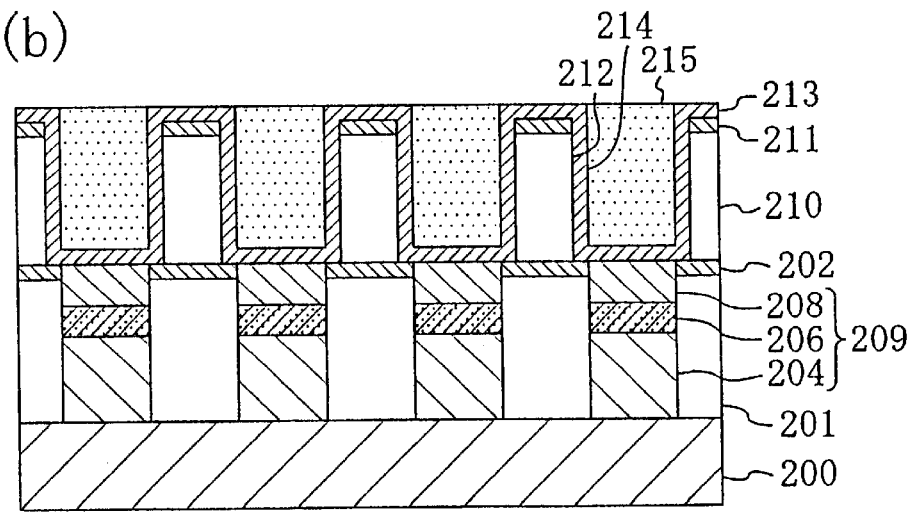

Next, as is shown in FIG. 9(b), a protection film 215 of, for example, a SiO$_2$ film is filled in the second recess 214. Specifically, the SiO$_2$ film is deposited on the entire surface of the silicon substrate 200 by, for example, the CVD so as to completely bury the second recess 214, and a portion of the SiO$_2$ film outside of the second recess 214 is removed by, for example, the CMP or etch back using dry etching. As a result, a portion of the first conductive film 213 outside of the first recess 212 is exposed.

Figure 9C:
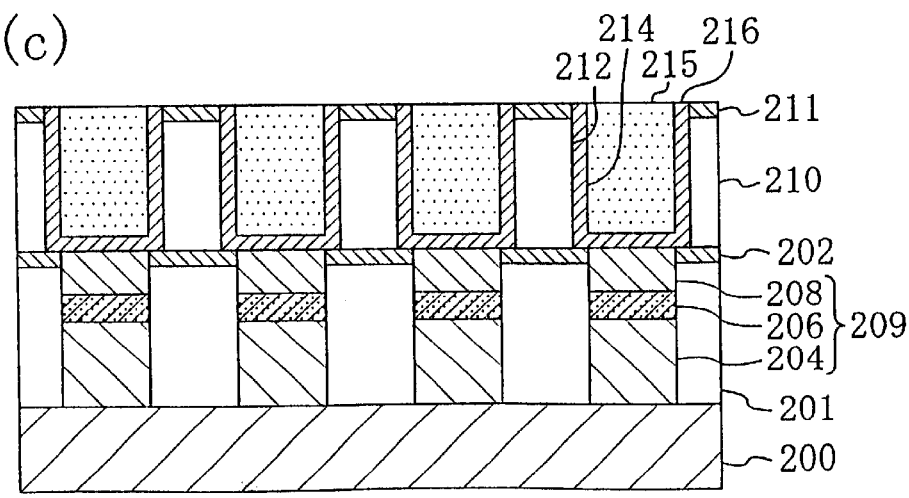

Then, as is shown in FIG. 9(c), the portion of the first conductive film 213 outside of the first recess 212 is removed by conducting material etching process, for example, dry etching on the first conductive film 213 by using the protection film 215 as a mask, thereby forming a bottom electrode 216 from the first conductive film 213 on the wall and the bottom of the first recess 212.

At this point, since the second protection Insulating film 211 (SiN film) has etch selectivity against the first conductive film 213 (platinum film), the second protection insulating film 211 serves as an etching stopper for preventing the second interlayer insulating film 210 from being removed in removing the portion of the first conductive film 213 outside of the first recess 212.

Figure 10A:
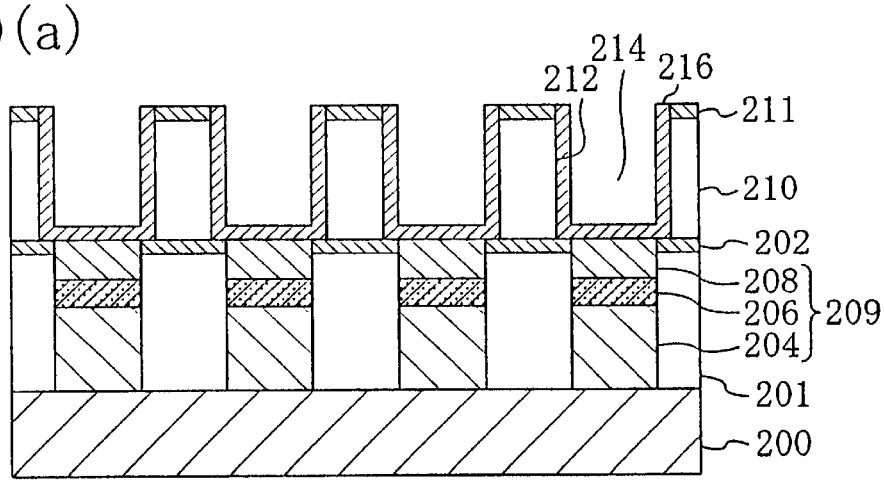
FIGS. 10(a) through 10(c) are sectional views for showing other procedures in the method of fabricating a semiconductor device of Embodiment 2.

Then, the protection film 215 is removed by, for example, wet etching or dry etching, thereby exposing the bottom electrode 216 as is shown in FIG. 10(a).

At this point, since the second protection insulating film 211 (SiN film) has etch selectivity against the protection film 215 (SiO$_2$ film), the second protection insulating film 211 serves as a mask for preventing the second interlayer insulating film 210 from being removed in removing the protection film 215.

Figure 10B:
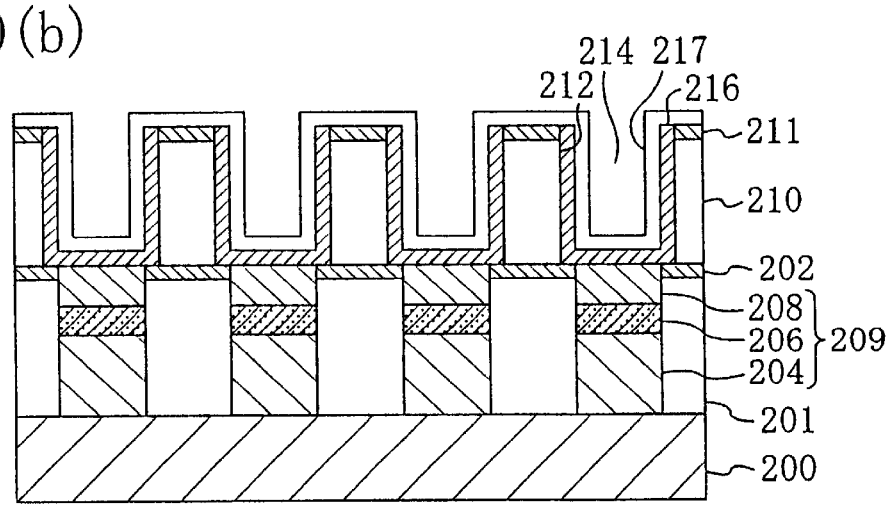

Next, as is shown in FIG. 10(b), a capacitor dielectric film 217 of, for example, a BST (barium strontium titanium oxide) film is deposited on the bottom electrode 216 so that an upper portion of the second recess 214 can remain.

Figure 10C:
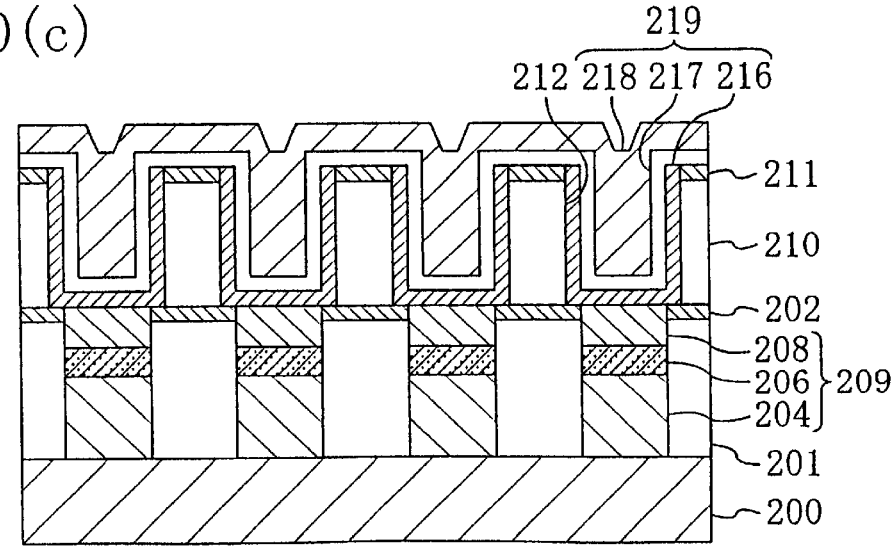

Then, as is shown in FIG. 10(c), a second conductive film of, for example, a platinum film is deposited on the capacitor dielectric film 217, and the second conductive film is patterned into a top electrode 218. In this manner, a capacitor 219 including the bottom electrode 216, the capacitor dielectric film 217 and the top electrode 218 and electrically connected to the plug 209 is formed in the first recess 212.

Thereafter, although not shown in the drawings, an interlayer insulating film is deposited on the capacitor 219, and a wire or a plug connected to the top electrode 218, namely, a plate electrode of the DRAM, is formed.

As described above, according to Embodiment 2, since the cobalt silicide layer 206 is formed in the plug 209, the resistance of the plug 209 can be reduced. Also, in the formation of the cobalt silicide layer 206 in the surface portion of the polysilicon film 204 through the heat treatment conducted after the cobalt film 205 is deposited on the polysilicon film 204 formed in the contact hole 203 with its upper portion remaining, cobalt atoms constituting the cobalt film 205 are diffused into silicon atoms constituting the polysilicon film 204. Accordingly, the cobalt silicide layer 206 is formed merely in the surface portion of the polysilicon film 204. In other words, the cobalt silicide layer 206 is not formed in the vicinity of the opening of the contact hole 203. Therefore, in forming the barrier layer 208 on the cobalt silicide layer 206 so as to form the plug 209 including the polysilicon film 204, the cobalt silicide layer 206 and the barrier layer 208, the barrier layer 208 can be formed on the entire top surface of the cobalt silicide layer 206. Therefore, the cobalt silicide layer 206 can be prevented from being in contact with the bottom electrode 216 of the capacitor 219 formed on the plug 209. Accordingly, the bottom electrode 216 can be prevented from being silicided during the formation thereof, and the cobalt silicide layer 206, namely, the plug 209, can be prevented from being oxidized in forming the capacitor dielectric film 217 on the bottom electrode 216.

Furthermore, according to Embodiment 2, the first conductive film 213 is deposited on the second interlayer insulating film 210 in which the first recess 212 has been formed, so that the second recess 214 can be formed inside of the first conductive film 213 within the first recess 212, the protection film 215 is then filled in the second recess 214, and thereafter, the portion of the first conductive film 213 outside of the first recess 212 is removed, thereby forming the bottom electrode 216 from the first conductive film 213 on the wall and the bottom of the first recess 212. Accordingly, while a portion of the first conductive film 213 inside of the first recess 212, namely, a portion of the first conductive film 213 to be formed into the bottom electrode 216, is being covered with the protection film 215, a portion of the first conductive film 213 outside of the first recess 212, namely, a portion of the first conductive film 213 not formed into the bottom electrode 216, can be removed. Accordingly, the bottom electrode 216 can be prevented from being contaminated with etching residue or the like, so as to improve the reliability of the capacitor 219. Furthermore, in the case where a material that is oxidized when exposed to oxygen plasma, such as ruthenium (Ru), is used for forming the bottom electrode 216, namely, the first conductive film 213, the bottom electrode 216 can be prevented from deforming through oxidation.

Moreover, in Embodiment 2, since the first protection insulating film 202 of the SiN film is formed on the first interlayer insulating film 201, the first protection insulating film 202 can be used as an etching stopper in forming the first recess 212 in the second interlayer insulating film 210 deposited on the first interlayer insulating film 201. Therefore, the first interlayer insulating film 201 can be prevented from being damaged.

Also in Embodiment 2, since the second protection insulating film 211 of the SiN film is formed on the second interlayer insulating film 210, the second protection insulating film 211 can be used as an etching stopper in removing the portion of the first conductive film 213 outside of the first recess 212. Therefore, the second interlayer insulating film 210 can be prevented from being damaged. Additionally, since the second protection insulating film 211 can be used as a mask in removing the protection film 215, the second interlayer insulating film 210 can be prevented from being damaged.

In Embodiment 2, the first conductive film 213 is formed from a platinum film and the first conductive film 213 is subjected to the heat treatment at approximately 400 through 750° C. after the deposition thereof. Therefore, the step coverage of the first conductive film 213 can be improved due to the grain growth, and hence, the first conductive film 213, namely, the bottom electrode 216, can be prevented from having a small thickness at its bent portions. Accordingly, the capacitor dielectric film 217 deposited on the bottom electrode 216 can be prevented from having a small thickness at its bent portions due to the step coverage of the capacitor dielectric film 217. As a result, a leakage current caused between the bottom electrode 216 and the top electrode 218 can be suppressed from increasing.

Furthermore, in Embodiment 2, the first conductive film 213 is etched by using the protection film 215 as a mask so as to remove the portion of the first conductive film 213 outside of the first recess 212. Therefore, as compared with a conventional etch back method using a resist, higher etch selectivity can be attained against the first conductive film 213. As a result, the portion of the first conductive film 213 outside of the first recess 212 can be accurately and easily removed.

Although the polysilicon film is used as a material for the plug 209 in Embodiment 2, the polysilicon film can be replaced with an amorphous silicon film or the like.

Although the SiN film is used for forming the first protection insulating film 202 in Embodiment 2, the SiN film can be replaced with any other insulating film having etch selectivity against the second interlayer insulating film 210. Specifically, in the case where a $SiO_2$ film is used for forming the second interlayer insulating film 210, a SiAlN film can be used for forming the first protection insulating film 202. In this case, the etch selectivity against the second interlayer insulating film 210 can be controlled by adjusting the mixing ratio of AlN, that is, a harder material having higher density than SiN (with the mixing ratio indicated as x, the film is a $Si_{1-x}Al_xN$ film).

Furthermore, although the SiN film is used for forming the second protection insulating film 211 in Embodiment 2, the SiN film can be replaced with any other insulating film having etch selectivity against the first conductive film 213 or the protection film 215. Specifically, in the case where the first conductive film 213 and the protection film 215 are formed from a platinum film and a $SiO_2$ film, respectively, the second protection insulating film 211 can be formed from a SiAlN film. In this case, the etch selectivity against the first conductive film 213 or the protection film 215 can be controlled by adjusting the mixing ratio of AlN, that is, a harder material having higher density than SiN.

Moreover, although the dry etching is employed for removing the portion of the first conductive film 213 outside of the first recess 212 in Embodiment 2, the CMP can be employed instead. In this case, the portion of the first conductive film 213 outside of the first recess 212 can be removed with a portion of the first conductive film 213 inside of the first recess 212 covered with the protection film 215. Therefore, the bottom electrode 216 can be prevented from being contaminated with CMP slurry or the like, resulting in improving the reliability of the capacitor 219. Also in this case, an insulating film exhibiting a lower polishing ratio in the CMP than the first conductive film 213 is preferably used for forming the second protection insulating film 211. Specifically, in the case where the first conductive film 213 is formed from a platinum film, a SiN film or a SiAlN film can be used for forming the second protection insulating film 211.

Also, although the TiN film is used for forming the barrier layer 208 in Embodiment 2, the TiN film can be replaced with a TiAlN film or the like.

Although the platinum film is used for forming the bottom electrode 216 or the top electrode 218 in Embodiment 2, the platinum film can be replaced with a ruthenium (Ru) film, an iridium (Ir) film, a palladium (Pd) film or an alloy film including at least two metals selected from the group consisting of platinum, ruthenium, iridium and palladium.

Furthermore, although the BST film is used for forming the capacitor dielectric film 217 in Embodiment 2, the BST film can be replaced with a $Ta_2O_5$ film or the like.

EMBODIMENT 3

A method of fabricating a semiconductor device according to Embodiment 3 of the invention will now be described with reference to the accompanying drawings.

In the method of Embodiment 3, the same procedures as those in the method of Embodiment 2 shown in FIGS. 6(a) through 6(d), 7(a) through 7(d), 8(a) through 8(c) and 9(a) through 9(c) are carried out, and therefore, merely procedures following the procedure of FIG. 9(c) will be herein described with reference to FIGS. 11(a) through 11(c).

Figure 11A:
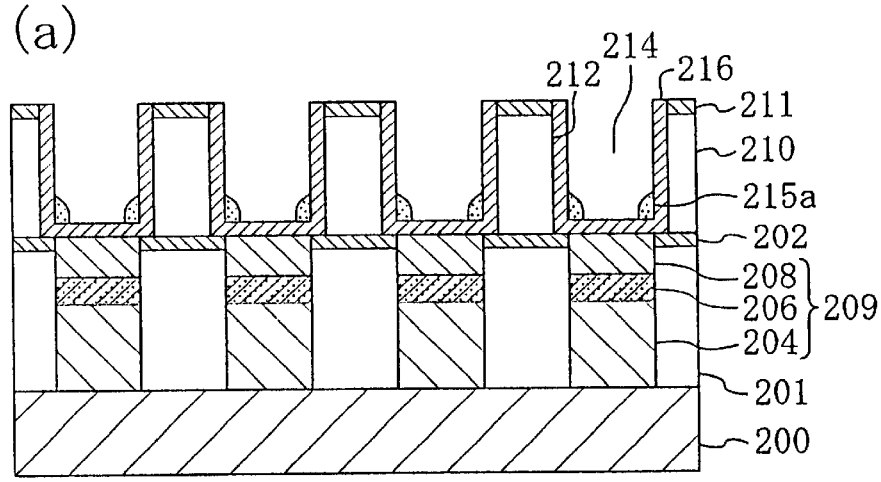
FIGS. 11(a) through 11(c) are sectional views for showing procedures in a method of fabricating a semiconductor device of Embodiment 3.

First, the protection film 215 (shown in FIG. 9(c)) is removed by, for example, wet etching or dry etching, so as to expose the bottom electrode 216 as is shown in FIG. 11(a). At this point, a part of the protection film 215 is allowed to remain on bent portions of the bottom electrode 216 as a partial protection film 215a.

Figure 11B:
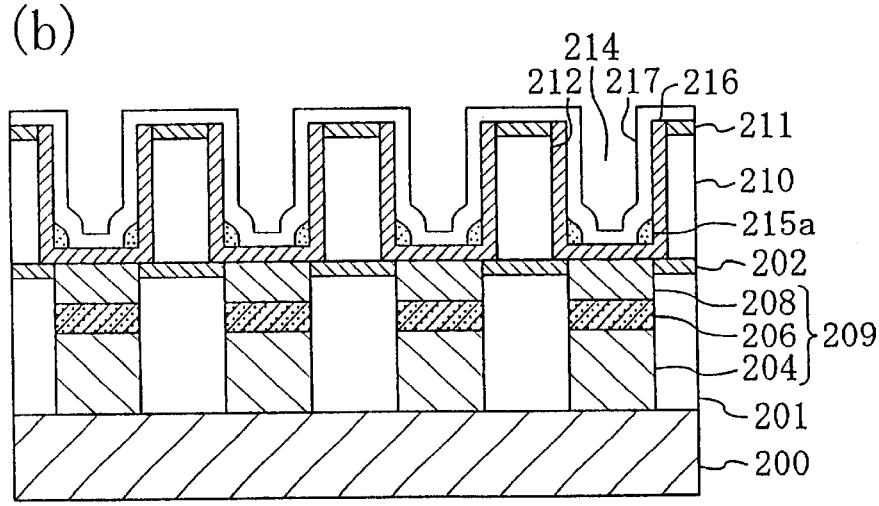

Next, as is shown in FIG. 11(b), a capacitor dielectric film 217 of, for example, a BST film is deposited on the bottom electrode 216 and the partial protection film 215 so that an upper portion of the second recess 214 can remain.

Figure 11C:
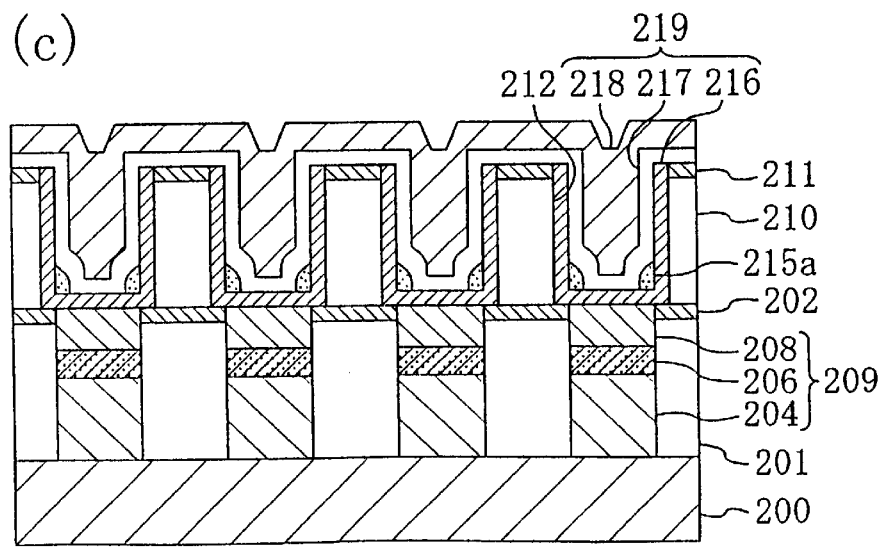
Figure 12:
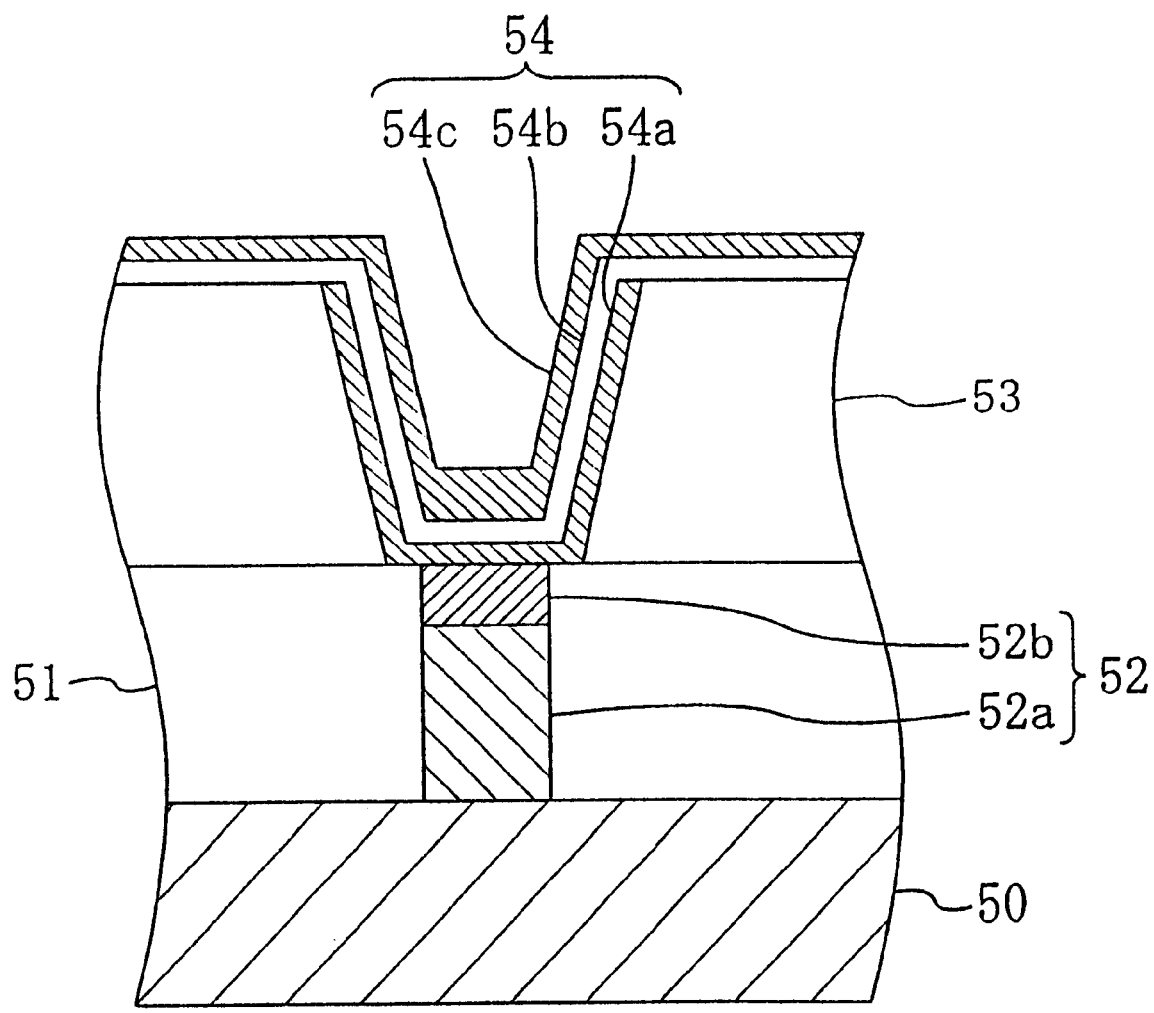
FIG. 12 is a sectional view of a conventional semiconductor device.
Figure 13A:
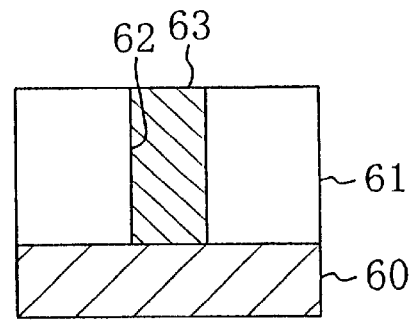
FIGS. 13(a) through 13(d) are sectional views for showing procedures in a method of siliciding a polysilicon film included in a plug by using titanium.
Figure 13B:
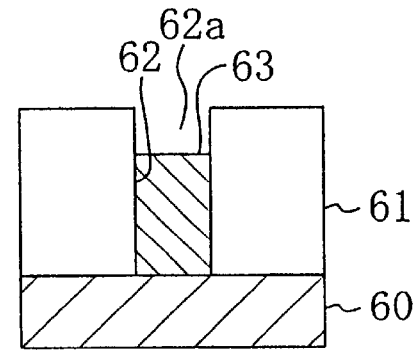
Figure 13C:
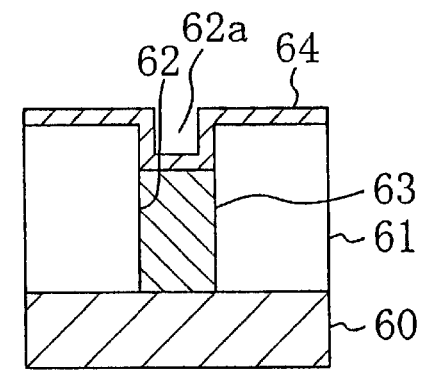
Figure 13D:
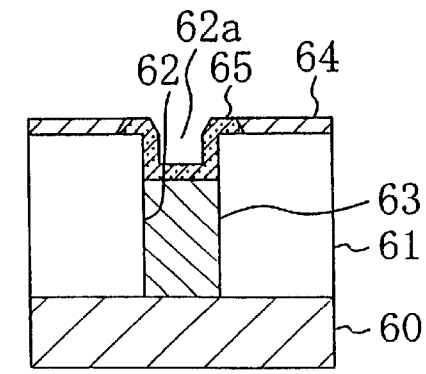
Figure 14A:
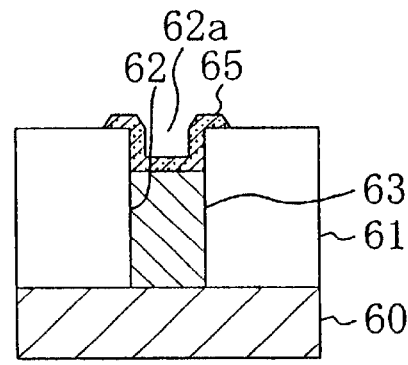
FIGS. 14(a) through 14(d) are sectional views for showing other procedures in the method of siliciding the polysilicon film included in the plug by using titanium .
Figure 14B:
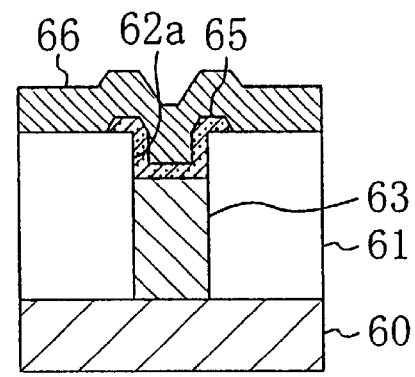
Figure 14C:
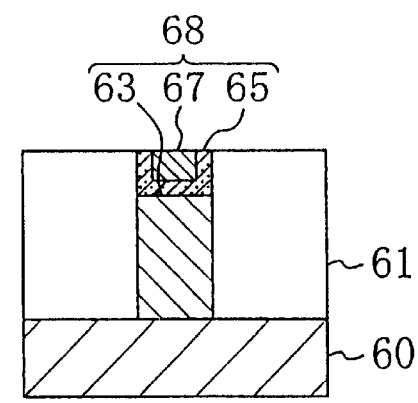
Figure 14D:
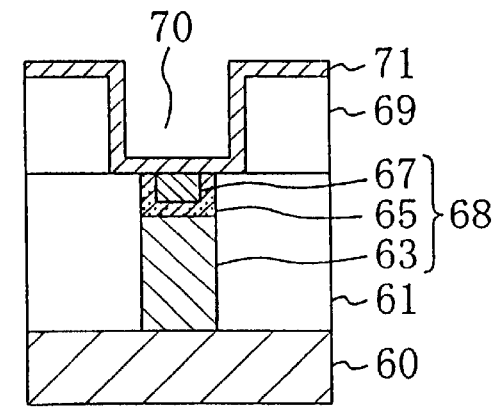

Then, as is shown in FIG. 11(c), a second conductive film of, for example, a platinum film is deposited on the capacitor dielectric film 217, and the second conductive film is then patterned into a top electrode 218. In this manner, a capacitor 219 including the bottom electrode 216, the capacitor dielectric film 217 and the top electrode 218 and electrically connected to the plug 209 is formed in the first recess 212.

According to Embodiment 3, the following effects can be attained in addition to the effects attained in Embodiment 2:

Since a part of the protection film 215 is allowed to remain as the partial protection film 215a on the bent portions of the bottom electrode 216 in removing the protection film 215 of the $SiO_2$ film, even when the bottom electrode 216 has a small thickness at its bent portions, the portions with the small thickness can be covered with the partial protection film 215a. Accordingly, the capacitor dielectric film 217 deposited on the bottom electrode 216 can be prevented from having a small thickness at its bent portions due to the step coverage of the capacitor dielectric film 217. As a result, a leakage current caused between the bottom electrode 216 and the top electrode 218 can be suppressed from increasing. Furthermore, even when a bent portion of the capacitor dielectric film 217 has a small thickness, short-circuit between the bottom electrode 216 and the top electrode 218 can be avoided owing to the partial protection film 215a remaining below the portion with the small thickness.

What is claimed is:

1. A semiconductor device comprising:

a plug buried in a first insulating film deposited on a semiconductor substrate; and a capacitor connected to said plug and including a bottom electrode, a capacitor dielectric film and a top electrode successively buried in a second insulating film deposited on said first insulating film, wherein said plug includes a cobalt silicide layer and a barrier layer formed on said cobalt silicide layer.

2. The semiconductor device of claim 1, wherein a protection insulating film of a SiN film or a SiAlN film is formed on said first insulating film.

3. The semiconductor device of claim 1, wherein a protection insulating film of a SiN film or a SiAlN film is formed on said second insulating film.

4. A method of fabricating a semiconductor device comprising:
- a first step of depositing a first insulating film on a semiconductor substrate;
- a second step of forming a contact hole in said first insulating film;
- a third step of forming a silicon film within said contact hole in a manner that an upper portion of said contact hole remains;
- a fourth step of forming a cobalt silicide layer in a surface portion of said silicon film by depositing a cobalt film on said silicon film and conducting a heat treatment for causing a reaction between said silicon film and said cobalt film;
- a fifth step of forming a barrier layer on said cobalt silicide layer so as to completely fill said contact hole, whereby a plug including said silicon film, said cobalt silicide layer and said barrier layer is formed in said contact hole;
- a sixth step of depositing a second insulating film on said first insulating film;
- a seventh step of forming a recess in said second insulating film for exposing a top surface of said plug; and
- an eighth step of successively forming, in said recess, a capacitor bottom electrode, a capacitor dielectric film and a capacitor top electrode.

5. The method of fabricating a semiconductor device of claim 4, further comprising, between said first step and said second step, a step of forming a protection insulating film from a SiN film or a SiAlN film on said first insulating film.

6. A method of fabricating a semiconductor device comprising:
- a first step of depositing an insulating film on a semiconductor substrate;
- a second step of forming a first recess in said insulating film;
- a third step of depositing a conductive film on said insulating film after forming said first recess in a manner that a second recess is formed inside of said conductive film within said first recess;
- a fourth step of filling said second recess with a protection film;
- a fifth step of forming a capacitor bottom electrode from said conductive film on a wall and a bottom of said first recess by removing a portion of said conductive film outside of said first recess; and
- a sixth step of exposing said capacitor bottom electrode by removing said protection film and successively forming a capacitor dielectric film and a capacitor top electrode on said capacitor bottom electrode.

7. The method of fabricating a semiconductor device of claim 6, further comprising, between said first step and said second step, a step of forming a protection insulating film from a SiN film or a SiAlN film on said insulating film.

8. The method of fabricating a semiconductor device of claim 6,
wherein said conductive film is formed from a platinum film, and
said third step includes a step of conducting aheat treatment on said conductive film at approximately 400 through 750° C. after depositing said conductive film.

9. The method of fabricating a semiconductor device of claim 6,
wherein, in said fifth step, the portion of said conductive film outside of said first recess is removed by conducting material etching process on said conductive film with said protection film used as a mask.

10. The method of fabricating a semiconductor device of claim 6,
wherein said protection film has an insulating property, and
in said sixth step, said protection film is removed with a part of said protection film allowed to remain on a bent portion of said capacitor bottom electrode.

* * * * *